United States Patent [19]

Epworth et al.

[11] Patent Number: 5,117,196
[45] Date of Patent: May 26, 1992

[54] OPTICAL AMPLIFIER GAIN CONTROL

[75] Inventors: Richard E. Epworth; Kevin C. Byron, both of Stortford; Robert A. Baker; Nigel Taylor, both of London, all of England

[73] Assignee: STC plc, London, England

[21] Appl. No.: 512,960

[22] Filed: Apr. 23, 1990

[30] Foreign Application Priority Data

Apr. 22, 1989 [GB] United Kingdom ............... 89009222

[51] Int. Cl.[5] .................... H01L 15/00; H01S 2/20; H01S 3/13
[52] U.S. Cl. ............................. 359/333; 372/31; 359/174; 359/181
[58] Field of Search .............. 330/4.3; 455/601, 611; 350/96.13; 372/81, 31

[56] References Cited

U.S. PATENT DOCUMENTS

| 4,092,615 | 5/1978 | Shimigu | 372/38 |
| 4,246,475 | 1/1981 | Altman | 455/612 |
| 4,309,671 | 1/1982 | Malyon | 372/31 |
| 4,698,817 | 10/1987 | Burley | 372/31 |
| 4,712,075 | 12/1987 | Switzer | 330/4.3 |
| 4,947,134 | 8/1990 | Olsson | 330/4.3 |

FOREIGN PATENT DOCUMENTS

| 0314373 | 5/1989 | European Pat. Off. | 330/4.3 |
| 0243383 | 10/1987 | Japan | 372/31 |
| 0244185 | 10/1987 | Japan | 372/31 |

OTHER PUBLICATIONS

Baker et al.. "Amplification of Mode-Locked . . . Amplifier", Electron. Lett., vol. 25, #17, pp. 1131-1133, Aug. 17, 1989, Abst. only.
Pettitt et al., "System Performance . . . Fibre Preamplifier", Elect. Lett., vol. 25, #4, pp. 273-275, Feb. 16, 1989, Abst. only.

Primary Examiner—Nelson Moskowitz
Attorney, Agent, or Firm—Lee, Mann, Smith McWilliams & Sweeney

[57] ABSTRACT

The gain of an optical amplifier is maintained constant by employing a portion of the amplified optical signal in a feedback loop. In one arrangement this is used to control the output of a pump signal source accordingly. The portion of the said signal corresponds to spontaneous emission (ASE) at a control wavelength or band of wavelengths different to the wavelength of the optical signal output. In the case of an erbium, for example, optical fibre amplifier the portion is preferably ASE at 980 nm, the amplified signal being at 1.535 $\mu$m, i.e. completely different transitions in the amplifying medium are used for gain and ASE feedback in order to lessen requirements on the filter used to extract the portion for the feedback loop.

9 Claims, 5 Drawing Sheets

OPTICAL AMPLIFIER GAIN CONTROL

BACKGROUND OF THE INVENTION

This invention relates to optical amplifiers and in particular to optical amplifier gain control.

For any systems application using an optical amplifier some form of control loop is required to stabilise device gain. This has been achieved with semiconductor amplifiers by monitoring the diode junction voltage, a technique not applicable to fibre amplifiers, for example.

SUMMARY OF THE INVENTION

According to one aspect of the invention there is provided an optical amplifier with automatic gain control including an input port for an optical signal to be amplified, means for achieving amplification of the optical signal, means for extracting a portion of the amplified signal, an output port for the remainder of the amplified optical signal, and feedback loop means for employing the extracted portion whereby to maintain the output amplified optical signal constant, the extracted portion comprising spontaneous emission at a control wavelength, or band of wavelengths, different to the wavelength, or band of wavelengths, of the output amplified optical signal.

According to another aspect of the invention there is provided a method of controlling the gain of an optical amplifier including the steps of amplifying an optical signal to be amplified, extracting a portion of the amplified optical signal and employing it in a feedback loop such as to maintain the gain of the amplified optical signal at a constant value, the extracted portion comprising spontaneous emission at a control wavelength, or band of wavelengths, different to the wavelength, or band of wavelengths, of the amplified optical signal.

BRIEF DESCRIPTION OF THE DRAWINGS

Embodiments of the invention will now be described with respect to the accompanying drawings, in FIG. 1 illustrates the ASE (amplified spontaneous emission) spectrum of erbium.

DESCRIPTION OF THE PREFERRED EMBODIMENT

Figure 2:
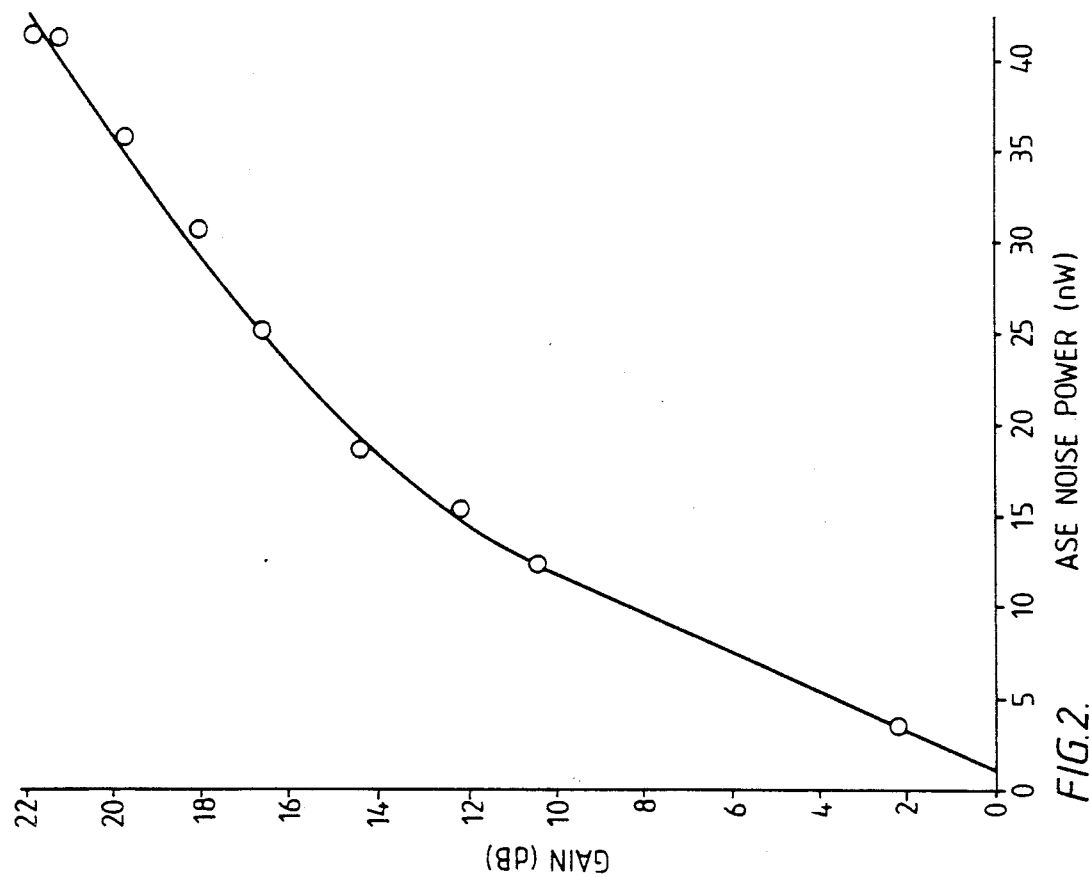
FIG. 2 is a graph of gain versus ASE noise power at 1.551 $\mu$m.
Figure 1:
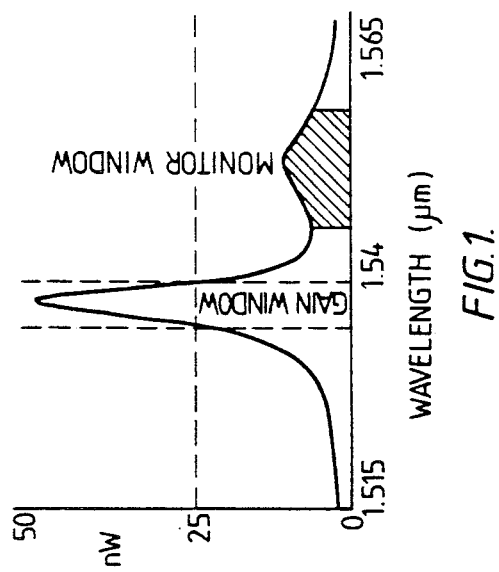

All optical amplifiers generate amplified spontaneous emission (ASE). An ASE spectrum for an erbium fibre amplifier is shown in FIG. 1. Outside of the 4 nm gain window centred on 1.536 $\mu$m lies a small ASE band centred on around 1.551 $\mu$m. The noise power at this latter wavelength is strongly dependent on the amplifier gain as indicated in FIG. 2, i.e. the intensity of spontaneous emission from the amplifier is dependent on amplifier gain. The signal at 1.551 $\mu$m can be used to form the basis of a gain control loop of the form illustrated in FIG. 3.

Figure 3:
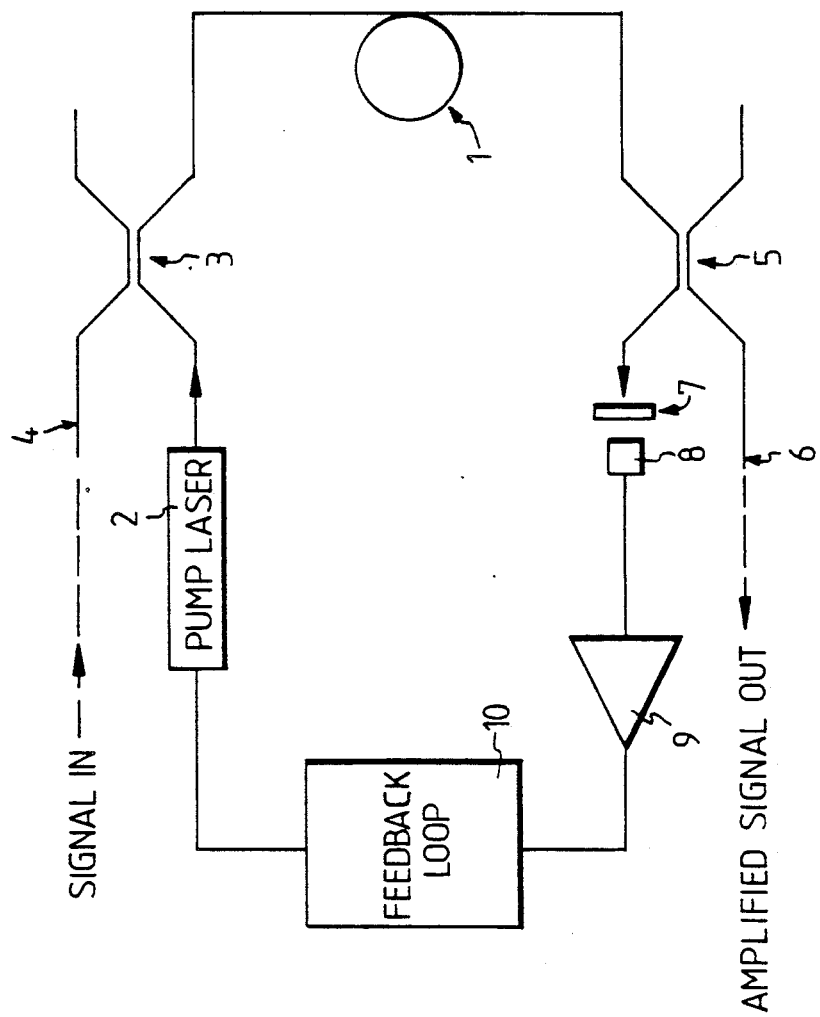
FIG. 3 illustrates a basic automatic gain control arrangement.

The arrangement of FIG. 3 comprises an erbium doped fibre 1, a pump laser 2, a wavelength multiplexer 3 which multiplexes the pump laser output and an input optical signal which is to be amplified and is input at port 4, a pump/signal demultiplexer 5, which serves to split off a small portion of the output signal and ASE at 1.5 $\mu$m as well as to remove excess pump light, an output port 6 for the amplified optical signal, a band-pass filter 7, a detector 8, an amplifier 9 and a feedback loop 10. The optical signal to be amplified is input via port 4, multiplexed with the optical pump signal output from laser 2 and amplified in the erbium doped fibre 1. A small proportion of the amplified signal output from fibre 1 is split off. This can conveniently be achieved by a fused fibre coupler indicated for the pump/signal demultiplexer 5. The band-pass filter 7 suppresses the amplified signal at 1.536 $\mu$m to isolate the 1.551 $\mu$m signal. This latter signal, which is employed as a control signal, is detected by detector 8, amplified at 9 and applied to the feedback loop 10 whose output is applied to the pump laser 2 and serves to vary the pump output power to maintain constant gain i.e. constant intensity of the spontaneous emission.

Thus in this arrangement amplifier gain at 1.535 $\mu$m is monitored by monitoring ASE in the low gain 1.551 $\mu$m centred window and the latter is used to keep the amplifier gain constant by means of the feedback loop which varies the power of the pump (amplifier pump power) accordingly.

One possible variant of this arrangement is to simply monitor the total amplified signal output power from the fibre amplifier by taking a small proportion of it and using it in a simple feedback loop to control the pump power to keep the amplifier output power constant. Thus in a repeatered submarine optical fibre cable system, for example, the output power from each amplifier is monitored and used to vary the associated pump power to keep the total output power constant. Whilst this may be attractive because terminal wavelength stability is relaxed, there is a major drawback in that the ASE will build up along the system length and this will strongly influence amplifiers near the end of the chain.

Figure 4:
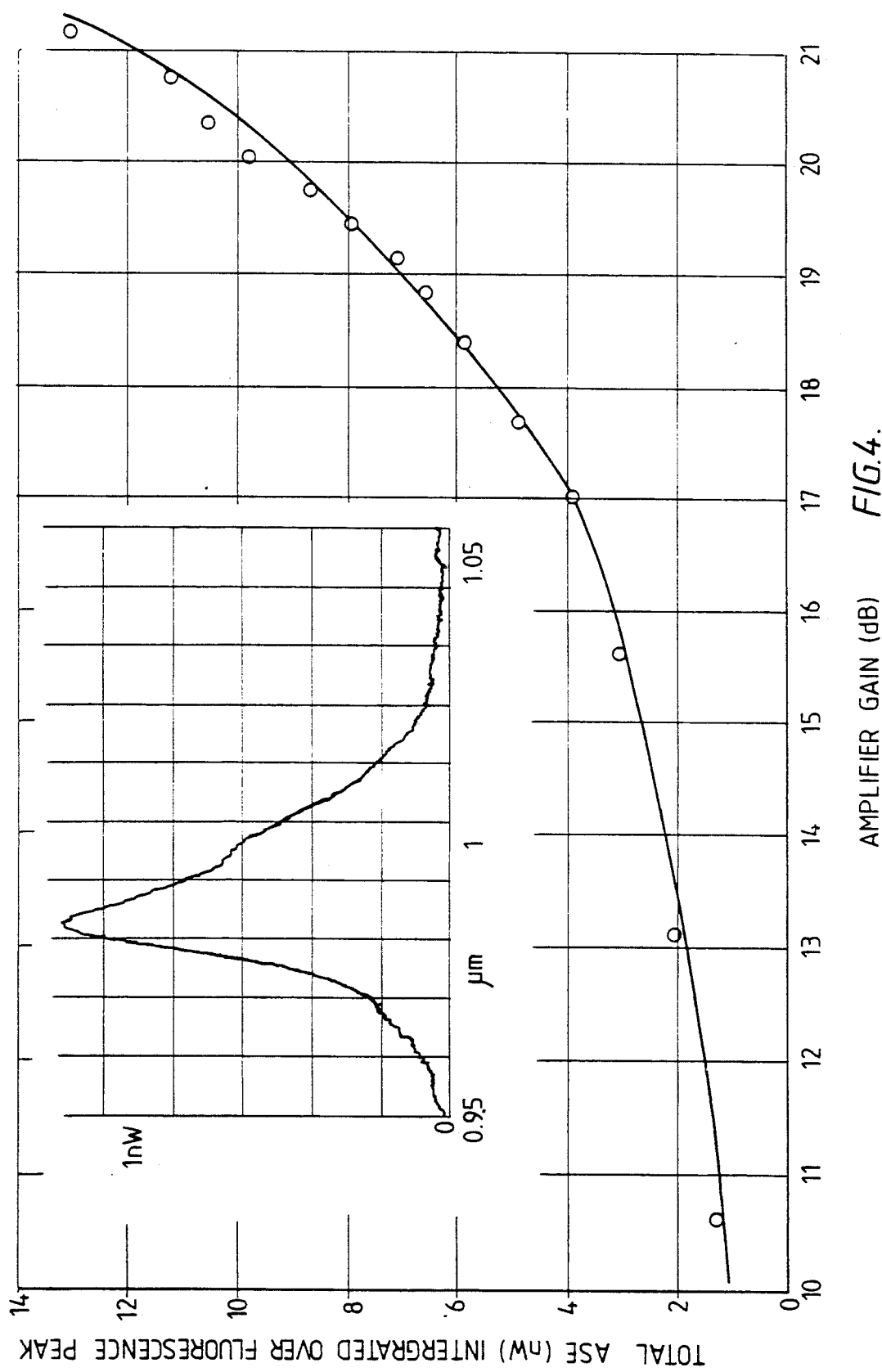
FIG. 4 illustrates a graph of total ASE at 980 nm versus amplifier gain, and (inset) the fluorescence spectrum of erbium in the vicinity of 980 nm.
Figure 5:
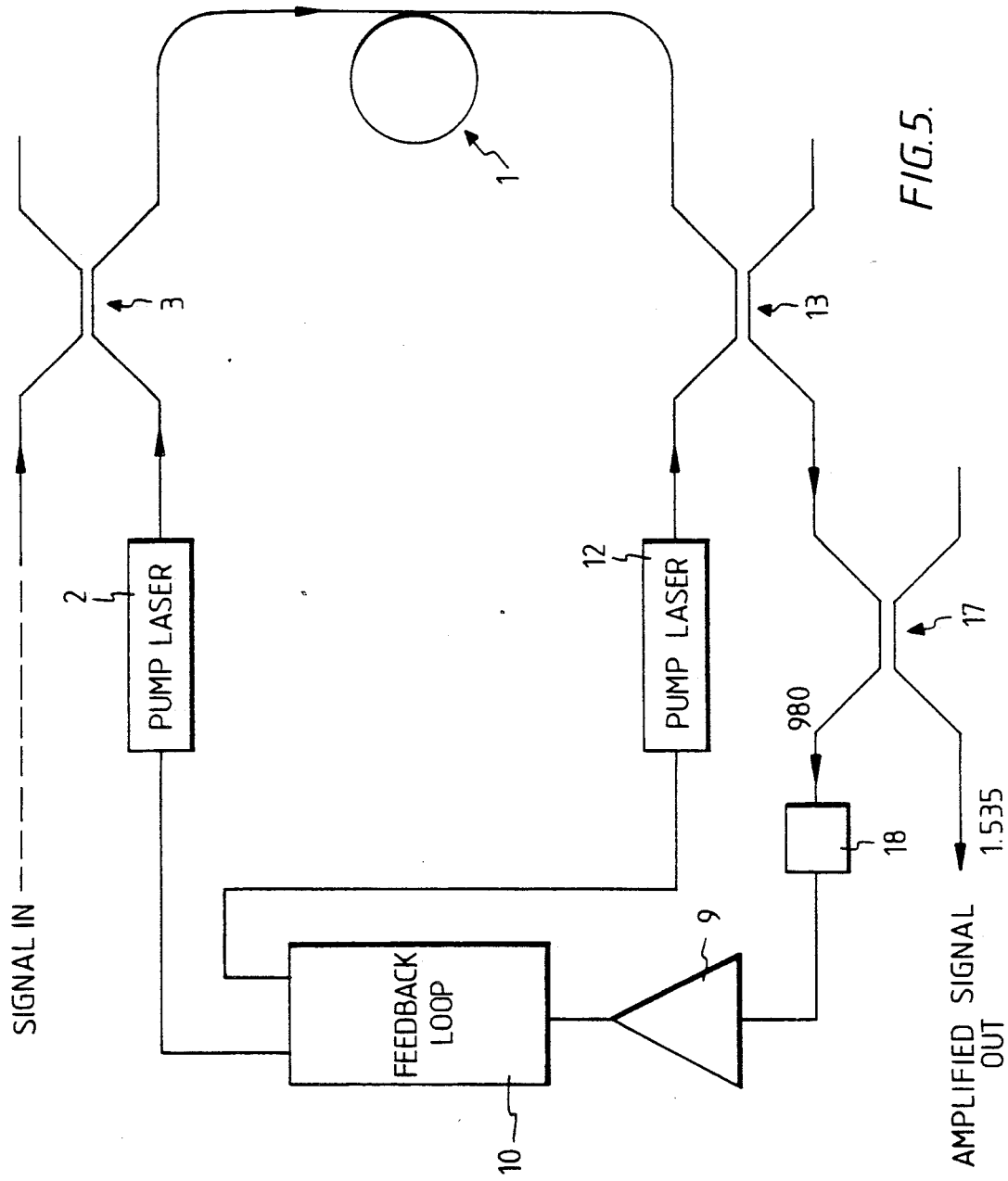
FIG. 5 illustrates an alternative automatic gain control arrangement.

The first mentioned arrangement employed the ASE of erbium at 1.551 $\mu$m whereas the gain window was centred on 1.535 $\mu$m, and difficulties arise due to the nearness of these two wavelengths. Now, ASE is also produced by erbium at 980 nm (see the inset in FIG. 4) and this has been found also to vary with amplifier gain as indicated in FIG. 4 with the result that this ASE at 980 nm can be employed to maintain amplifier gain constant. FIG. 5 illustrates an AGC arrangement which uses ASE at 980 nm for an erbium-doped fibre amplifier whose gain window is centred on 1.535 $\mu$m. The arrangement of FIG. 5 is similar in various respects to that of FIG. 3, one major difference being that the narrow-band filter (band-pass filter) 7 is replaced by a broad-band filter, which is illustrated as a dichroic fused fibre coupler 17 which outputs at 980 nm or 1.535 $\mu$m as illustrated. Another possible option to this and other arrangements is the incorporation of a second pump laser 12 which is also controlled by the feedback loop 10. This serves to reverse as well as forward pump the amplifier fibre and to keep the pump signal within the loop. An extra item in the arrangement of FIG. 5 is a further pump/signal multiplexer 13. The arrangement of FIG. 5 thus optically amplifies an input optical signal and simultaneously controls the optical gain to a predetermined value. The ASE at 980 nm is detected by detector 18 and is not transmitted out of the loop. In the case of a chain of such amplifiers linked by 1.55 μm transmitting optical fibre as in a repeatered submarine system any 980 nm ASE from a previous stage would be attenuated strongly since it lies outside the transmission windows of the fibre.

The arrangement of FIG. 3 thus uses amplified spontaneous emission (ASE) produced in the gain band width to provide feedback, for example with $Er^{3+}$, ASE emission at 1.551 μm and a main gain peak at 1.535 μm. The arrangement of FIG. 5, however, uses ASE produced from a completely different transition in the amplifying medium, this being applicable mainly to rare-earth and transition metal doped fibres, to provide the feedback signal, for example with $ER^{3+}$ gain is obtained from the $^4I_{13/2} \rightarrow {}^4I_{15/2}$ transition, whereas the ASE is
from the $^4I_{11/2} \rightarrow {}^4I_{15/2}$ transition at 980 nm.

Whereas the above has basically referred to erbium-doped fibre amplifiers the arrangements are applicable to any optical amplifiers, for example laser fibre, Raman or semiconductor, all that is required is the existence of a sufficiently broad spontaneous emission band spaced apart from the employed gain band.

Instead of $Er^{3+}$ other rare earth dopants can be used e.g. $Nd^{3+}$, $Tm^{3+}$, $Yb^{3+}$ which have spontaneous emission from energy levels other than those associated with the gain wavelength.

Figure 6:
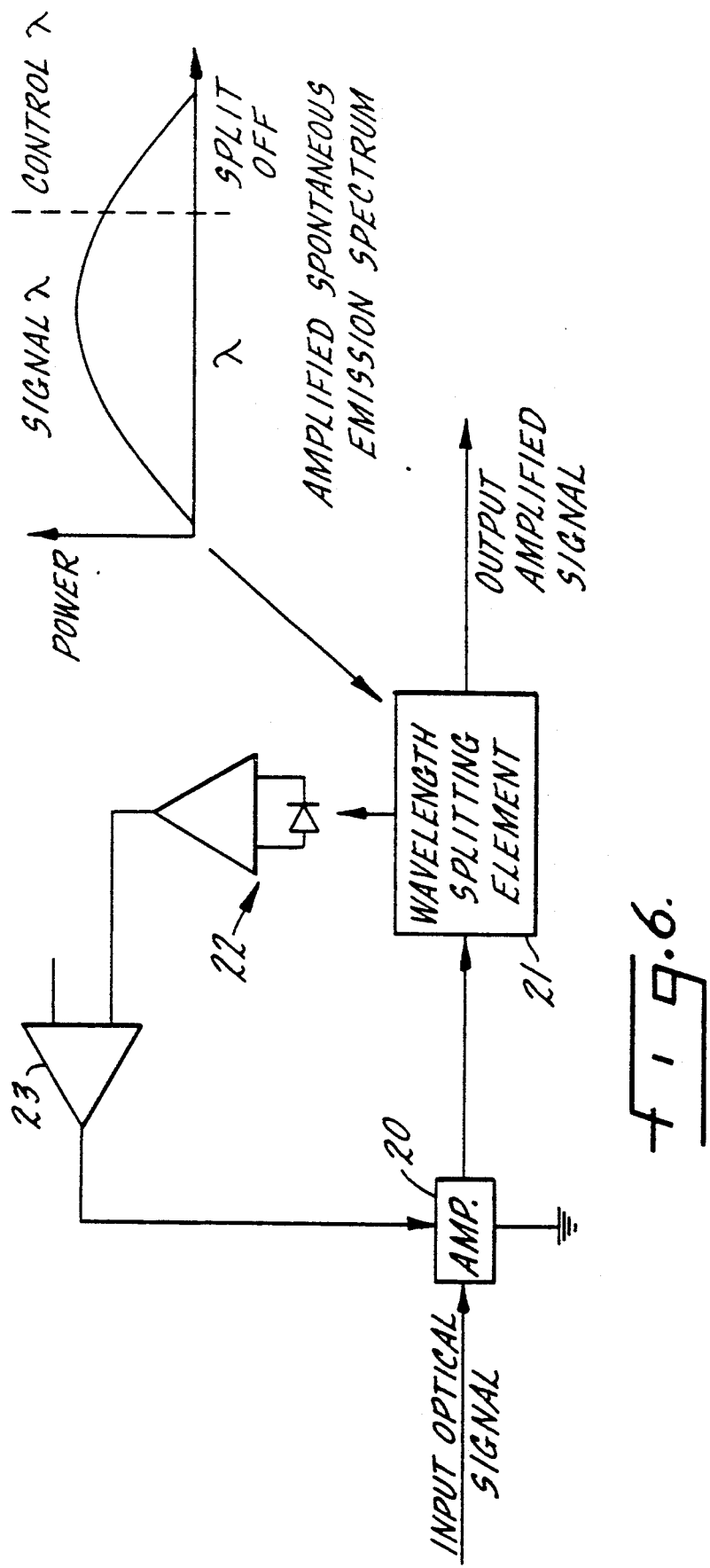
FIG. 6 illustrates an automatic gain control for a semiconductor amplifier.

The basic technique employed above is that by sensing ASE from the amplifier, the gain at a wavelength different from that being sensed can be determined, e.g. ASE at 980 nm or 1.55 μm and gain at 1.53 μm in the examples described. In the above amplifying fibre cases, the pump's power into the amplifying fibre is adjusted to maintain the spontaneous emission constant, thereby achieving automatic gain control As mentioned previously the above arrangements are also applicable to semiconductor amplifiers, the latter exhibiting a broad spectrum of spontaneous emission (50-100 nm), and a particular arrangement for semiconductor amplifiers is shown in FIG. 6. In this case the aim is to split off a narrow spectral portion of the spontaneous emission (see inset in FIG. 6) and vary the bias to the semiconductor amplifier 20 to maintain this constant, in much the same way as the pump laser 2 is adjusted in the fibre amplifier arrangements. FIG. 6 shows a basic arrangement for achieving this. The semiconductor amplifier is applied to a wavelength splitting element 21 which splits off the control spectral portion (see inset). This is detected by a photodetector arrangement 22 whose output is applied to the amplifier 20, via a comparator 23, to vary the bias on the amplifier 20 to maintain the selected portion of the spontaneous emission constant.

A disadvantage of optical amplifier is that they produce crosstalk between multiple signals and the problem is particularly severe with semiconductor amplifiers. If the bandwidth of the feedback is sufficiently large i.e. greater than the signal bandwidth, the automatic gain control of the present invention will suppress crosstalk between multiple signals by clamping the gain, thus obviating the aforementioned disadvantage.

We claim:

1. An optical amplifier with automatic gain control including an input port for an optical signal to be amplified, means for achieving amplification of the optical signal, means for extracting a portion of the amplified signal, an output port for the remainder of the amplified optical signal, and feedback loop means for employing the extracted portion whereby to maintain the output amplified optical signal constant, the extracted portion comprising spontaneous emission at a control wavelength, or band of wavelengths, different to the wavelength, or band of wavelengths, of the output amplified optical signal.

2. An optical amplifier as claimed in claim 1 and including an optical pump signal source and means for combining the optical signal to be amplified and the optical pump signal for amplification of the optical signal.

3. An optical amplifier as claimed in claim 2 wherein the means to employ the extracted portion comprise detector means to convert the extracted optical signal to a corresponding electrical signal, means to amplify said electrical signal and an electronic feedback loop to which said amplified electronic signal is applied and which produces an output employed to drive the pump signal source in such a manner as to maintain the amplifier gain constant.

4. An optical amplifier as claimed in claim 1 wherein the amplification is achieved in a length of amplifying optical fibre.

5. An optical amplifier as claimed in claim 3 and including a second optical pump signal source which is driven by the electronic feedback loop and whose optical output is coupled to the means wherein amplification is achieved for reverse pumping thereof.

6. An optical amplifier as claimed in claim 1 wherein the amplification means comprises a semiconductor amplifier and the extraction means comprises a wavelength splitting element, and including means to vary the bias to the semiconductor amplifier such as to maintain the split-off portion constant.

7. A method of controlling the gain of an optical amplifier including the steps of amplifying an optical signal to be amplified, extracting a portion of the amplified optical signal and employing it in a feedback loop such as to maintain the gain of the amplified optical signal at a constant value, the extracted portion comprising spontaneous emission at a control wavelength, or band of wavelengths, different to the wavelength, or band of wavelengths, of the amplified optical signal.

8. A method as claimed in claim 7 and including the step of combining the optical signal to be amplified with an optical pump signal, applying said combined signals to a length of amplifying optical fibre whereby to achieve said amplification, and employing said extracted portion to drive a source of the optical pump signal whereby to maintain said gain constant.

9. A method as claimed in claim 7 and including the step of applying said optical signal to semiconductor amplifier for said amplification and employing said extracted portion to vary the bias on the semiconductor amplifier whereby to maintain said extracted portion constant.

* * * * *